United States Patent [19]

Gurney et al.

[11] Patent Number: 5,408,377
[45] Date of Patent: Apr. 18, 1995

[54] MAGNETORESISTIVE SENSOR WITH IMPROVED FERROMAGNETIC SENSING LAYER AND MAGNETIC RECORDING SYSTEM USING THE SENSOR

[75] Inventors: Bruce A. Gurney, Santa Clara; Haralambos Lefakis, San Jose; Omar U. Need, III, San Jose; Stuart S. P. Parkin, San Jose; Virgil S. Speriosu, San Jose; Dennis R. Wilhoit, Morgan Hill, all of Calif.

[73] Assignee: International Business Machines Corporation, Armonk, N.Y.

[21] Appl. No.: 138,170

[22] Filed: Oct. 15, 1993

[51] Int. Cl.$^6$ .......................... G11B 5/127; G11B 5/33
[52] U.S. Cl. .................................. 360/113; 338/32 R; 324/252
[58] Field of Search ........... 360/113; 338/32 R, 32 H; 324/252

[56] References Cited

U.S. PATENT DOCUMENTS

| | | | |
|---|---|---|---|
| 4,103,315 | 7/1985 | Hempstead et al. | 360/110 |
| 4,949,039 | 8/1990 | Grunberg | 324/252 |
| 5,134,533 | 7/1992 | Friedrich et al. | 360/113 |
| 5,159,513 | 10/1992 | Dieny et al. | 360/113 |
| 5,206,590 | 4/1993 | Dieny et al. | 324/252 |
| 5,287,238 | 2/1994 | Baumgart et al. | 360/113 |

(List continued on next page.)

OTHER PUBLICATIONS

Binasch et al., "Enhanced Magnetoresistance in Layered Magnetic Structures with Antiferromagnetic Interlayer Exchange", Physical Review B, vol. 39, No. 7, Mar. 1, 1989, pp. 4828–4830.
Dieny et al., "Change in Conductance is the Fundamental Measure of Spin-Valve Magnetoresistance", Applied Physics Letters, vol. 61, No. 17, Oct. 26, 1992; pp. 2111–2113.
Dieny, "Quantitative Interpretation of Giant Magnetoresistance Properties of Permalloy-based Spin-Valve Structures", Europhysics Letters, vol. 17, No. 3, Jan. 14, 1992, pp. 261–267.
Dieny, "Classical Theory of Giant Magnetoresistance in Spin-Valve Multilayers: Influence of Thicknesses, Number of Periods, Bulk and Interfacial Spin-dependent Scattering", Journal of Physics:Condensed Matter, vol. 4, 1992, pp. 8009–8020.
Dieny et al., "Giant Magnetoresistance in Soft Ferromagnetic Multilayers", Physical Review B, vol. 43, No. 1, Jan. 1, 1991, pp. 1297–1300.
Levy, "Giant Magnetoresistance in Magnetic Layered (List continued on next page.)

Primary Examiner—Stuart S. Levy
Assistant Examiner—William J. Klimowicz
Attorney, Agent, or Firm—Thomas R. Berthold

[57] ABSTRACT

A magnetic recording data storage system of high recording density is made possible by an improved magnetoresistive sensor. The sensor has a ferromagnetic sensing layer that is a laminated layer of two ferromagnetic films antiferromagnetically coupled to one another and separated by an antiferromagnetically coupling film. By appropriate selection of the thickness of the nonmagnetic antiferromagnetically coupling film, the ferromagnetic films become antiferromagnetically coupled and their magnetizations rotate as a single rigid unit in the presence of the external magnetic field to be sensed. The ferromagnetic sensing layer can be used in conventional magnetoresistive sensors of the anisotropic magnetoresistive (AMR) type and in spin valve magnetoresistive (SVMR) sensors. In the spin valve sensor, the laminated ferromagnetic sensing layer serves as the free layer and is preferably formed of two films of nickel-iron (Ni-Fe) separated by a ruthenium (Ru) antiferromagnetically coupling film. Because the two ferromagnetic films have their moments aligned antiparallel, then, assuming the two films are made of the same material, by selecting the two films to have different thicknesses the effective free layer thickness can be reduced without significantly reducing the magnetoresistance.

30 Claims, 8 Drawing Sheets

U.S. PATENT DOCUMENTS

| | | | |
|---|---|---|---|
| 5,301,079 | 4/1994 | Cain et al. | 360/113 |
| 5,304,975 | 4/1994 | Saito et al. | 338/32 R |
| 5,313,186 | 5/1994 | Schuhl et al. | 338/32 R |
| 5,315,468 | 5/1994 | Lin et al. | 360/113 |
| 5,341,261 | 8/1994 | Dieny et al. | 360/113 |

OTHER PUBLICATIONS and Granular Materials", Science, vol. 256, May 15, 1992, pp. 972–973.

Parkin et al., "Giant Magnetoresistance in Antiferromagnetic Co/Cu Multilayers", Applied Physics Letters, vol. 58, No. 23, Jun. 10, 1991, pp. 2710–2712.

Parkin et al., "Spin Engineering: Direct Determination of the Ruderman-Kittel-Kasuya-Yosida Fair-field Range Function in Ruthenium", Physical Review B, vol. 44, No. 13, Oct. 1, 1991, pp. 7131–7134.

Parkin et al., "Oscillations in Exchange Coupling and Magnetoresistance in Metallic Superlattice Structures: Co/Ru, Co/Cr, and Fe/Cr", Physical Review Letters, vol. 64, No. 19, May 7, 1990, pp. 2304–2307.

Parkin et al., "Oscillatory Magnetic Exchange Coupling Through Thin Copper Layers", Physical Review Letters, vol. 66, No. 16, Apr. 22, 1991, pp. 2152–2155.

Parkin, "Systematic Variation of the Strength and Oscillation Period of Indirect Magnetic Exchange Coupling Through the 3d, 4d, and 5d Transition Metals", Physical Review Letters, vol. 67, No. 25, Dec. 1991, pp. 3598–3601.

Parkin, "Giant Magnetoresistance and Oscillatory Interlayer Exchange Coupling in Copper Based Multilayers", Materials Research Society Symposium Proceedings, vol. 231, 1992, pp. 211–216.

Pennisi, "Magnetic Advantage: Magnetic Fields Make New Thin Films Better Conductors", Science News, vol. 142, Aug. 29, 1992, pp. 140–142.

MAGNETORESISTIVE SENSOR WITH IMPROVED FERROMAGNETIC SENSING LAYER AND MAGNETIC RECORDING SYSTEM USING THE SENSOR

TECHNICAL FIELD

This invention relates generally to conventional magnetoresistive (MR) sensors, and to MR sensors based on the spin valve effect, for sensing magnetic fields. More particularly, the invention relates to such sensors having improved ferromagnetic sensing layers and to magnetic recording systems which incorporate such sensors.

BACKGROUND OF THE INVENTION

An MR sensor detects magnetic field signals through the resistance changes of a read element, fabricated of a magnetic material, as a function of the strength and direction of magnetic flux being sensed by the read element. The conventional MR sensor, such as that used in the IBM "Corsair" disk drive, operates on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensed current or voltage.

A different and more pronounced magnetoresistance, sometimes called giant magnetoresistance (GMR) or the spin valve effect, has been observed in a variety of magnetic multilayered structures, the essential feature being at least two ferromagnetic metal layers separated by a nonferromagnetic metal layer. This GMR effect has been found in a variety of systems, such as Fe/Cr, Co/Cu, or Co/Ru multilayers exhibiting strong antiferromagnetic coupling of the ferromagnetic layers, as well as in essentially uncoupled layered structures in which the magnetization orientation in one of the two ferromagnetic layers is fixed or pinned. The physical origin is the same in all types of structures: the application of an external magnetic field causes a variation in the relative orientation of the magnetizations of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure comprising two uncoupled ferromagnetic layers separated by a nonmagnetic metallic layer in which the magnetization of one of the ferromagnetic layers is pinned. The pinning may be achieved by depositing the layer onto an iron-manganese (Fe-Mn) layer to exchange couple the two layers. This results in a spin valve magnetoresistive sensor in which only the unpinned or free ferromagnetic layer is free to rotate in the presence of an external magnetic field. U.S. Pat. No. 5,206,590, filed Dec. 11, 1990, and assigned to IBM, discloses a basic spin valve MR sensor. U.S. Pat. No. 5,159,513, filed Feb. 8, 1991, and also assigned to IBM, discloses a spin valve MR sensor in which at least one of the ferromagnetic layers is of cobalt or a cobalt alloy, and in which the magnetizations of the two ferromagnetic layers are maintained substantially perpendicular to each other at zero externally applied magnetic field by exchange coupling of the pinned ferromagnetic layer to an antiferromagnetic layer.

To meet the requirement for increasing data densities in today's magnetic storage systems, it is required that the magnetic flux sensing layers or read elements in MR sensors (both AMR and spin valve) be fabricated in progressively thinner layers of ferromagnetic material. However, MR sensors utilizing ultrathin magnetic flux sensing layers exhibit degraded magnetoresistance (i.e., deltaR/R) for both AMR and spin valve sensors.

SUMMARY OF THE INVENTION

The invention is an improved magnetoresistive sensor, and magnetic recording system using the sensor, wherein the ferromagnetic sensing layer is a laminated layer of two ferromagnetic films antiferromagnetically coupled to one another across a thin spacer film. This spacer film is referred to as the antiferromagnetically (AF) coupling film. The ferromagnetic sensing layer can be used in AMR and spin valve sensors. In the spin valve embodiment, the laminated ferromagnetic sensing layer serves as the free layer. Because the two ferromagnetic films have their moments aligned antiparallel, by selecting the two films to have different thicknesses the effective free layer thickness can be reduced without significantly reducing the amount of magnetoresistance. In the case where the two films are made of the same material, such as Ni-Fe, the spin valve sensor operates as the typical spin valve sensor if the free Ni-Fe film nearest the spin valve spacer layer is the thicker of the two free films, i.e., the resistance decreases when the net magnetic moments of the free and pinned layers move toward parallel. The ferromagnetic sensing layer can be used in a spin valve sensor which has its resistance increased for parallel alignment of the net moments of the free and pinned layers by making the Ni-Fe film nearest the spin valve spacer layer to be the thinner of the two Ni-Fe films so that the net moment of the free layer is antiparallel to the moment of the free film adjacent to the spacer layer.

For a fuller understanding of the nature and advantages of the present invention, reference should be made to the following detailed description taken together with the accompanying figures.

DETAILED DESCRIPTION OF THE INVENTION

Prior Art

Figure 1:
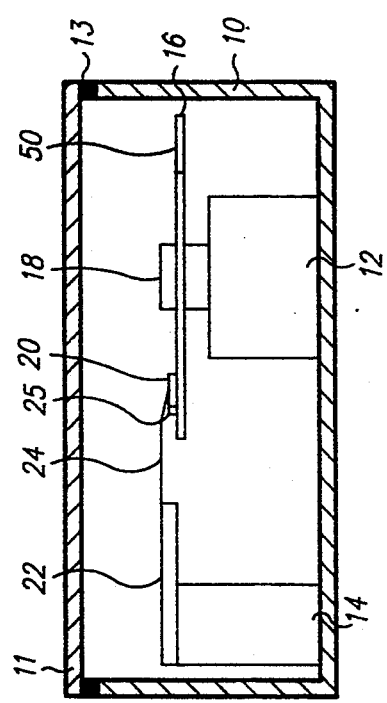
FIG. 1 is a simplified block diagram of a magnetic recording disk drive for use with the MR sensor according to the present invention.

Although the MR sensor of the present invention will be described as embodied in a magnetic disk storage system, as shown in FIG. 1, the invention is also applicable to other magnetic recording systems, such as a magnetic tape recording system, and to magnetic random access memory systems wherein a magnetoresistive element serves as a bit cell.

Referring to FIG. 1, there is illustrated in sectional view a schematic of a prior art disk drive of the type using an MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin continuous lubricant film 50 is maintained on the surface of disk 16. A read/write head or transducer 25 is formed on the trailing end of a carrier, such as an air-bearing slider 20. Transducer 25 may be an inductive read and write transducer or an inductive write transducer with a magnetoresistive (MR) read transducer of the type to be described. The slider 20 is connected to the actuator 14 by means of a rigid arm 22 and a suspension 24. The suspension 24 provides a biasing force which urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head may access different data tracks on disk 16.

Figure 2:
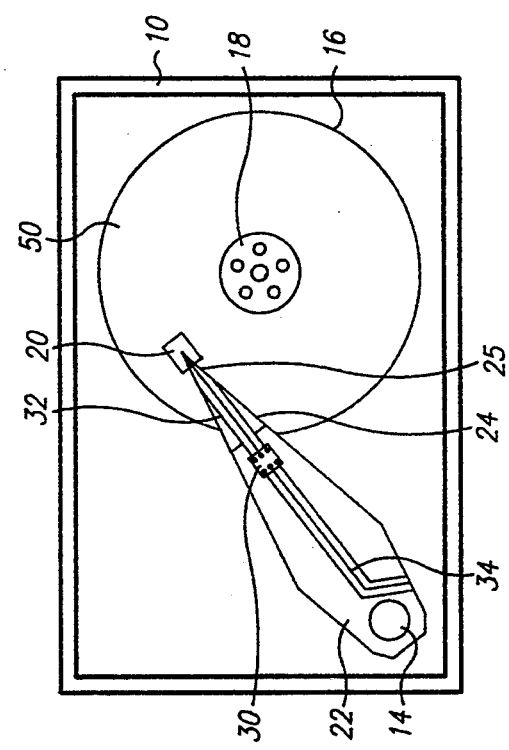
FIG. 2 is a top view of the disk drive of FIG. 1 with the cover removed.

FIG. 2 is a top view of the interior of the disk drive with the cover 11 removed, and illustrates in better detail the suspension 24 which provides a force to the slider 20 to urge it toward the disk 16. The suspension may be a conventional type of suspension such as the well-known Watrous suspension, as described in U.S. Pat. No. 4,167,765, assigned to IBM. This type of suspension also provides a gimbaled attachment of the slider which allows the slider to pitch axed roll as it rides on the air bearing. The data detected from disk 16 by the transducer 25 is processed into a data readback signal by signal amplification and processing circuitry in the integrated circuit chip 30 located on arm 22. The signals from transducer 25 travel via flex cable 32 to chip 30, which sends its output signals via cable 34.

The above description of a typical magnetic disk storage system, and the accompanying FIGS. 1 and 2, are for representation purposes only. Disk storage systems may contain a large number of disks and actuators, and each actuator may support a number of sliders. In addition, instead of an air-bearing slider, the head carrier may be one which maintains the head in contact or near contact with the disk, such as in liquid bearing and other contact recording disk drives.

Figure 3:
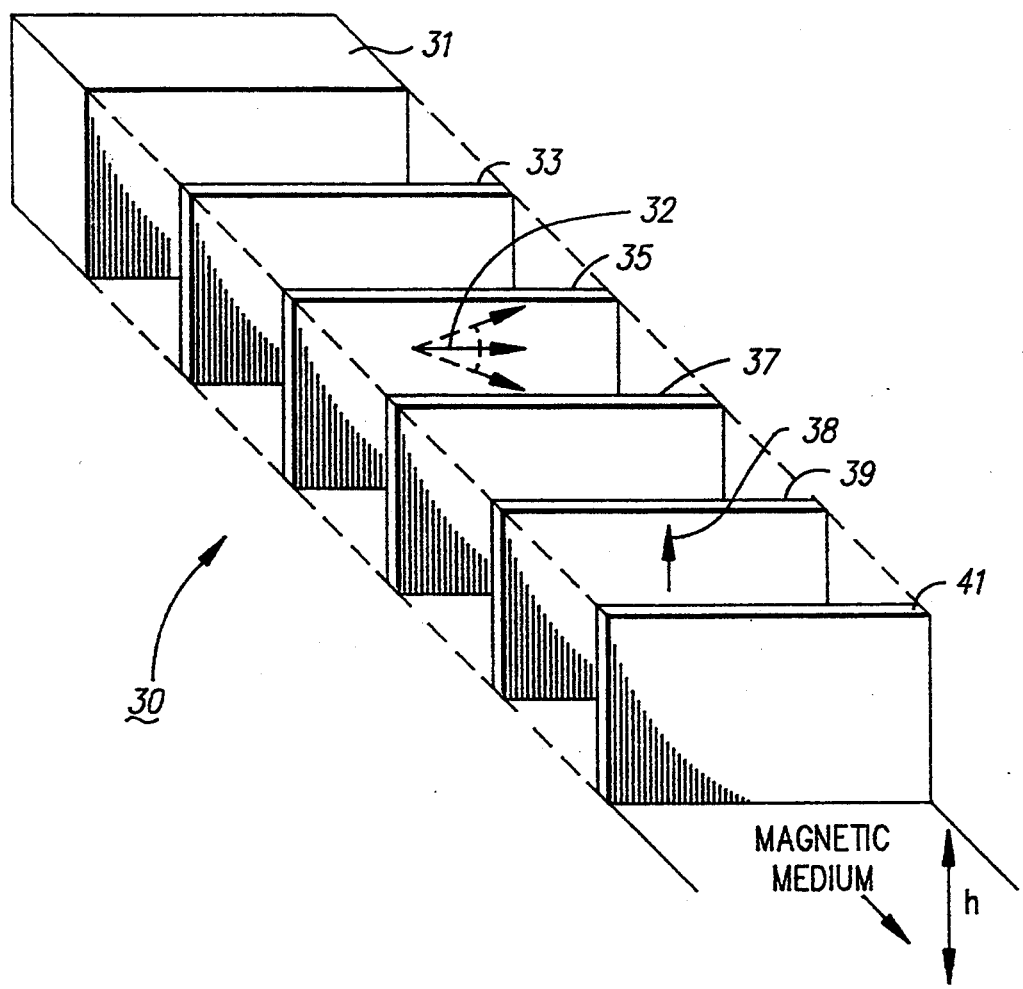
FIG. 3 is an exploded perspective view of a prior art spin valve MR sensor.

Referring now to FIG. 3, a prior art spin valve MR sensor 30 comprises a suitable substrate 31 such as glass, ceramic or a semiconductor, for example, upon which is deposited a buffer layer 33, a first thin layer 35 of soft ferromagnetic material such as permalloy (Ni-Fe), a thin nonferromagnetic metallic spacer layer 37, and a second thin layer 39 of ferromagnetic material such as Ni-Fe. The MR sensor 30 may form part of transducer 25 in the disk drive of FIGS. 1 and 2, and the substrate 31 may be the trailing end of the head carrier or slider 20. In the absence of an externally applied magnetic field from the recorded magnetic medium, the magnetizations of the two layers 35, 39 of ferromagnetic material are oriented at an angle, preferably of about 90 degrees, with respect to each other as indicated by arrows 32 and 38, respectively. The ferromagnetic layer 35 is called the "free" ferromagnetic layer because its magnetization is free to rotate its direction in response to an externally applied magnetic field (such as magnetic field "h" from the magnetic medium as shown in FIG. 3), as shown by the dashed arrows on layer 35. The ferromagnetic layer 39 is called the "pinned" ferromagnetic layer because its magnetization direction is fixed or pinned in a preferred orientation, as shown by the arrow 38. A thin film layer 41 of an exchange biasing material having relatively high electrical resistance is deposited in direct contact with the ferromagnetic layer 39 to provide a biasing field by exchange coupling. Layer 41 thus pins the magnetization of the ferromagnetic layer 39 in a preferred direction so that it cannot rotate its direction in the presence of an applied external magnetic field. The exchange bias layer 41 is typically a suitable antiferromagnetic material, such as iron-manganese (Fe-Mn) or Dickel-manganese (Ni-Mn). Alternatively, the second ferromagnetic layer 39 can be pinned using a hard bias layer (not shown) or by other suitable methods as is known in the art.

Figure 4:
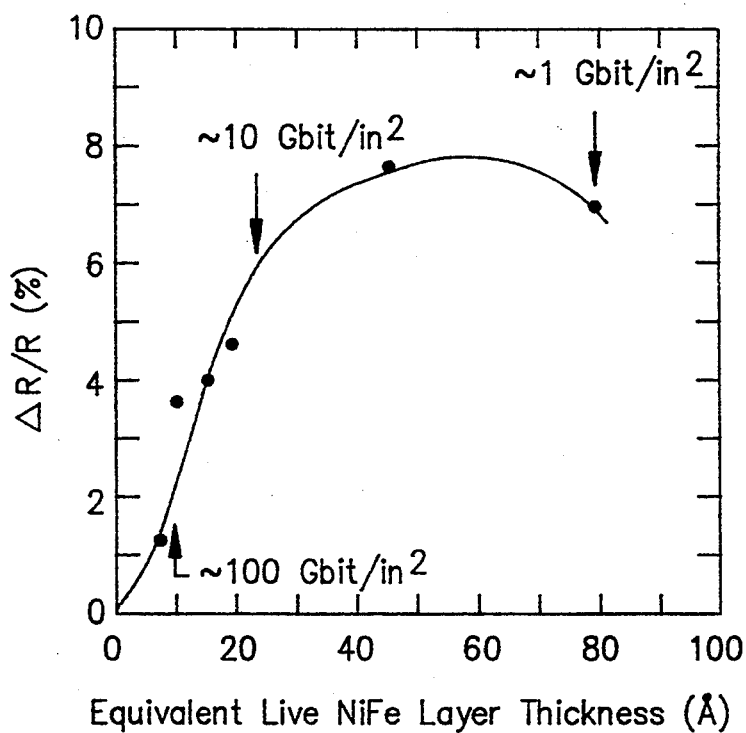
FIG. 4 is a graph of magnetoresistance as a function of free ferromagnetic layer thickness for a typical spin valve MR sensor.

The relationship of thickness of the free ferromagnetic layer in a spin valve sensor of the type similar to that shown in FIG. 3 on the requirements for increased data storage density is shown in FIG. 4. The sensor on which the data of FIG. 4 is based was a spin valve sensor like that shown in FIG. 3, but which also included thin cobalt (Co) films in the free and pinned layers adjacent the spin valve spacer layer. The curve of FIG. 4 shows the relationship between the "equivalent" "live" Ni-Fe free layer thickness and the magnetoresistance (deltaR/R in percent) in a spin valve MR sensor. By "equivalent" Ni-Fe thickness is meant the calculated thickness the free layer would have to be if the free layer were made of just Ni-Fe rather than Ni-Fe with the thin Co film. By "live" Ni-Fe thickness is meant the actual thickness of the Ni-Fe free layer which possesses a magnetic moment, and thus excludes the surfaces of the layer which may have become mixed with adjacent films or oxidized. Thus, the live thickness is less than the total thickness of the Ni-Fe free ferromagnetic layer. The vertical arrows on the curve in FIG. 4 indicate the direction of increased data density of the medium in gigabits per square inch (Gbit/in$^2$) and show that as the required density goes from 1 Gbit/in$^2$ to 100 Gbit/in$^2$, the required free layer thickness decreases significantly. Corresponding with this decreased thickness is a decrease in the magnetoresistance of the sensor.

Figure 5:
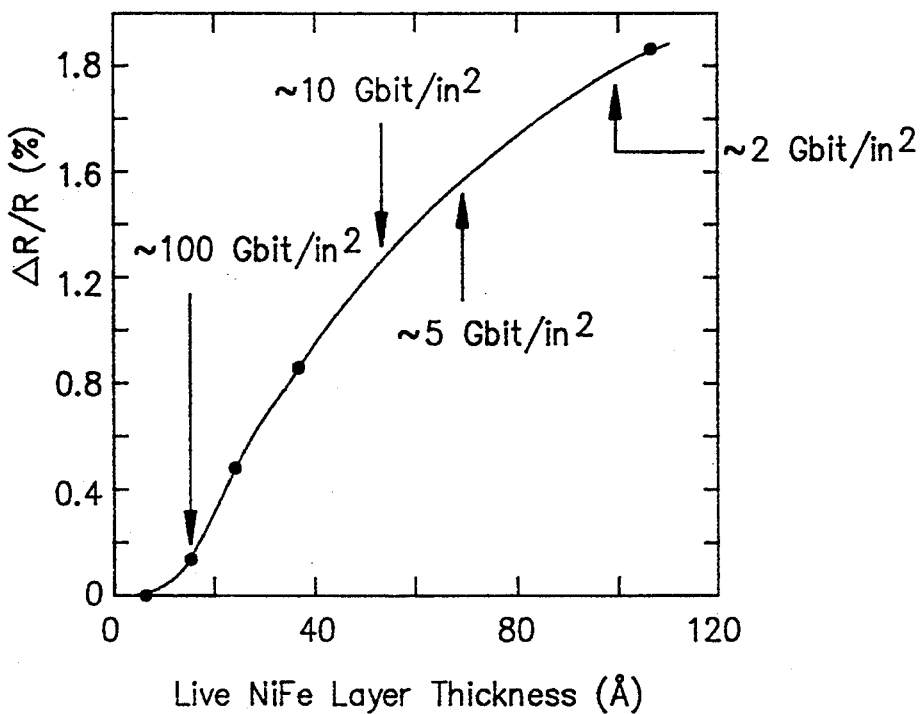
FIG. 5 is a graph of magnetoresistance as a function of ferromagnetic sensing layer thickness in an AMR sensor.

FIG. 5 represents a similar relationship to that of FIG. 4 but for the MR element of a conventional AMR sensor. The data of FIG. 5 is from an AMR structure comprising a glass substrate, a 50Å tantalum (Ta) film, a Ni-Fe layer as the MR read element or ferromagnetic sensing layer, and a 50Å tantalum protective film.

The deltaR/R decreases with ferromagnetic sensing layer thickness in both spin valve MR sensors and AMR sensors, as shown in FIGS. 4 and 5. Thus, FIGS. 4 and 5 demonstrate the problem to which the present invention is directed, namely the need to increase deltaR/R as the ferromagnetic sensing layer thickness decreases in both spin valve MR sensors and AMR sensors.

Preferred Embodiments

In the present invention, the ferromagnetic sensing layer is replaced by a laminated structure comprising at least two ferromagnetic films separated by a thin AF coupling film. The two ferromagnetic films are strongly antiferromagnetically coupled to one another, by means of the appropriate type and thickness of the AF coupling film, so that their magnetizations are oriented antiparallel to one another. The two films respond as a single unit to an applied magnetic field with a net magnetic moment determined by the type of materials used and the thicknesses of the films. However, the magnetoresistance remains large since each film is relatively thick.

Figure 6:
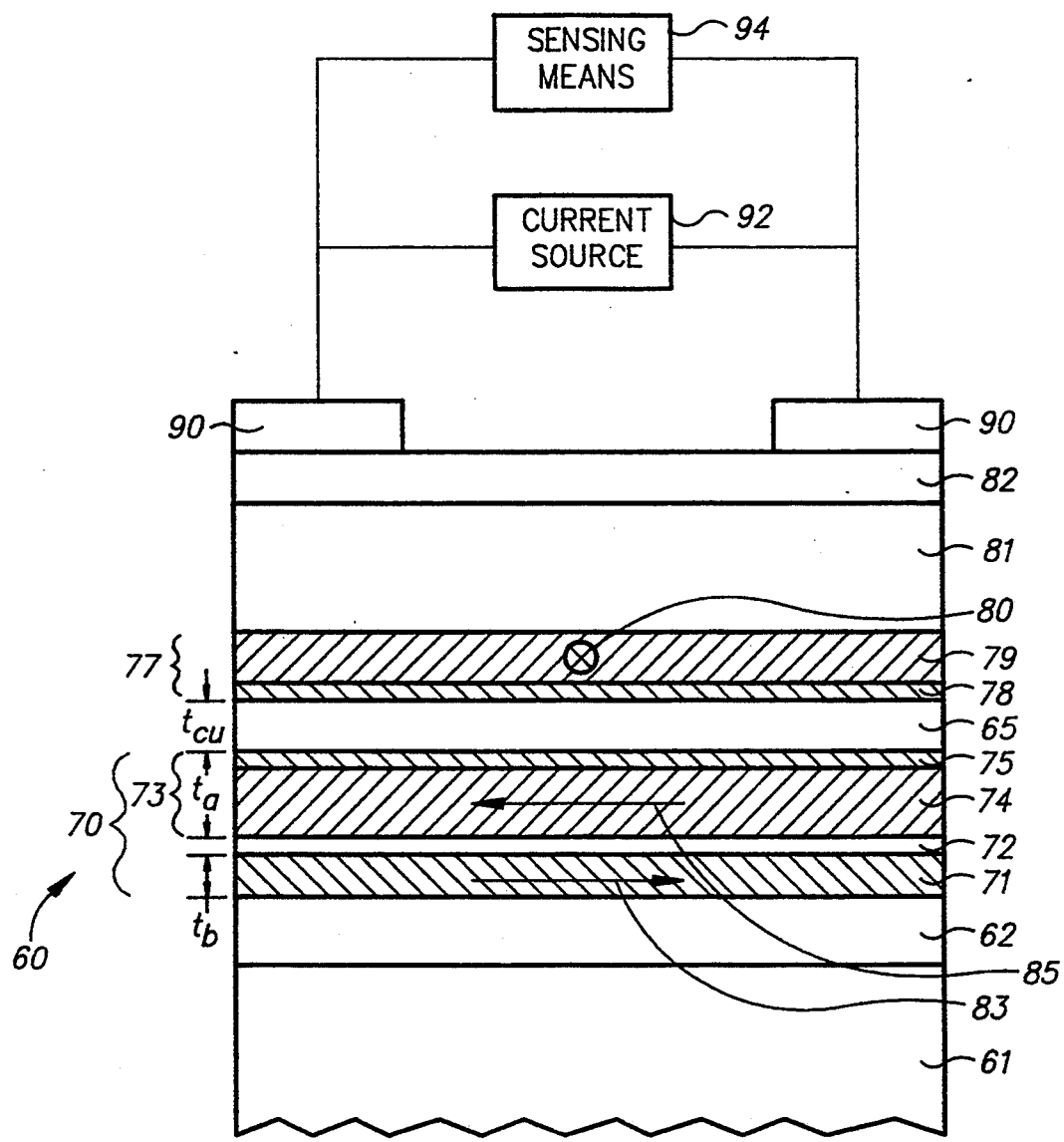
FIG. 6 is a sectional view of the spin valve MR sensor embodiment illustrating a laminated ferromagnetic sensing layer as the free ferromagnetic layer according to the present invention.

The preferred spin valve MR sensor embodiment according to the present invention is shown schematically in FIG. 6. A spin valve MR sensor 60 as shown in FIG. 6 was fabricated by DC magnetron sputter deposition in the presence of an applied magnetic field. First, a 50Å Ta film was deposited as a buffer layer 62 onto a glass substrate 61. The free ferromagnetic layer 70, which replaces the single-layer free layer 35 in the prior art structure of FIG. 3, is a laminated structure that comprises a first free ferromagnetic film 71 of Ni$_{80}$Fe$_{20}$ having a thickness $t_b$ formed on the Ta buffer layer 62, a 4Å ruthenium (Ru) AF coupling film 72 deposited on the first ferromagnetic film 71, and a second free ferromagnetic film 73 having a thickness $t_a$ formed on the Ru film 72. The second free ferromagnetic film 73 comprises a Ni$_{80}$Fe$_{20}$ film 74 deposited directly on the Ru AF coupling film 72 and a cobalt (Co) film 75 of 8Å thickness deposited directly on the Ni-Fe film 74.

A copper (Cu) spacer layer 65 was next deposited onto the Co film 75 to a thickness, $t_{Cu}$, to serve as the nonferromagnetic metallic spacer for the spin valve structure. While Cu was used as the spin valve spacer layer in this embodiment, other nonferromagnetic metallic materials with relatively high conductivity, such as silver (Ag) and gold (Au) and their alloys, can be used.

The ferromagnetic layer 77, which is to become the pinned layer, comprises a 8Å Co film 78 deposited on the Cu spacer layer 65 and a 30Å, Ni$_{80}$Fe$_{20}$ film 79 deposited on the Co film 78. An iron-manganese (Fe-Mn) film 81 of 110Å thickness was then deposited on the Ni-Fe film 79 to exchange couple with it and the Co film 78. The Fe-Mn film 81 pins the direction of magnetization of layer 77 in the direction of arrow 80 (into the paper) by subsequent cooling, in the presence of the applied magnetic field, from a temperature above the Fe-Mn blocking temperature, as is known in the art. In the finished structure, the two free ferromagnetic films 71, 73 have their magnetization directions 83, 85, respectively, aligned antiparallel with one another and generally perpendicular to the magnetization direction 80 of the pinned layer 77. In the finished structure, only the magnetization of the laminated free ferromagnetic layer 70 rotates in the presence of an applied signal field. Finally, a capping layer 82 of 50Å of Ta was formed over the Fe-Mn film 81. Other suitable capping materials are high resistivity materials, such as zirconium (Zr) or alloys of Cu and gold (Au).

While in the preferred embodiment the free ferromagnetic film 73 and the pinned ferromagnetic layer 77 each include a thin Co film adjacent to the Cu spacer layer 65, it is possible to form both film 73 and layer 77 of a single ferromagnetic material. The Co films 75, 78 increase the magnetoresistance of the sensor but are maintained relatively thin, in the range of 2-20Å, to minimize the effect of the relatively "hard" magnetic Co material on the permeability of the sensor.

FIG. 6 also illustrates schematically the means for connecting the spin valve MR sensor 60 to sensing circuitry in the magnetic recording system. Electrical leads 90 are provided to form a circuit path between the MR sensor and a current source 92 and a sensing means 94. As is well known in the art, additional sensor elements, such as a longitudinal bias layer (not shown), may be required to provide an optimal MR sensor response circuit. In the preferred embodiment, a magnetic signal in the medium is sensed by the sensing means 94 detecting the change in resistance, deltaR, of the MR sensor as the magnetization of the free ferromagnetic layer 70 rotates in response to the applied signal field from the recorded medium.

Figure 7:
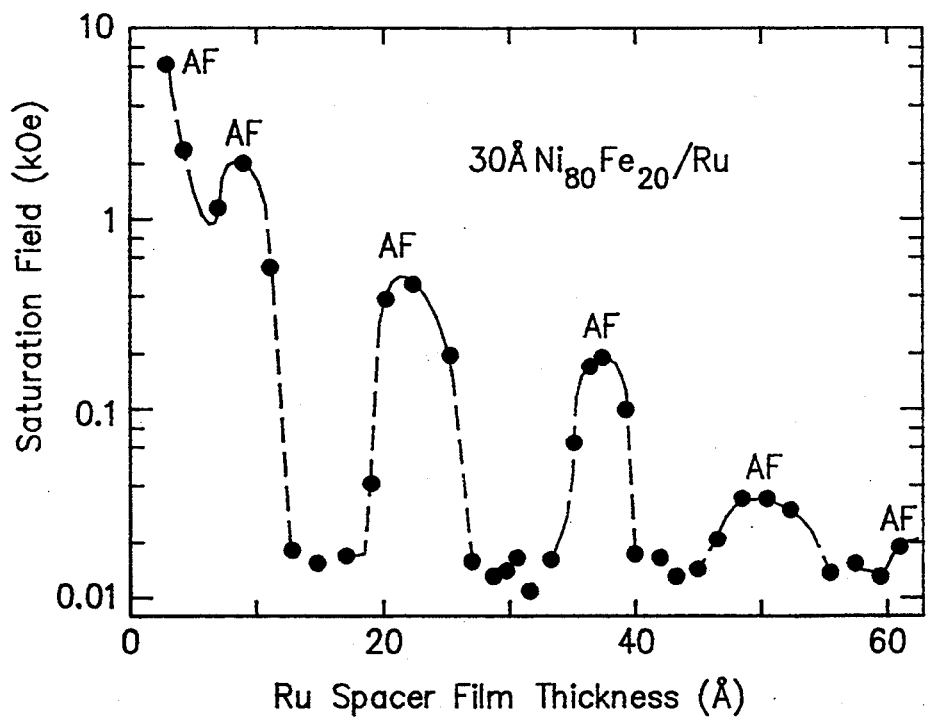
FIG. 7 is a graph of saturation magnetic field strength versus AF coupling film thickness for a Ni-Fe/Ru/Ni-Fe laminated structure.

The two free ferromagnetic films 71, 73 in the laminated free layer 70 have magnetization directions indicated by arrows 83, 85, respectively. The antiparallel alignment of the magnetizations of the two films 71, 73 is due to an antiferromagnetic exchange coupling through Ru AF coupling film 72. Depending upon the materials selected for the ferromagnetic films 71, 73 and AF coupling film 72 making up the laminated free layer 70, there is a preferred AF coupling film thickness at which the ferromagnetic films become strongly antiferromagnetically coupled. For the case of the Ni-Fe/Ru combination, the thickness of the Ru AF coupling film can be selected with reference to FIG. 7. FIG. 7 is a graph of the saturation field as a function of Ru spacer layer thickness for a 30Å Ni$_{80}$Fe$_{20}$/Ru combination. The peaks of this oscillatory relationship (designated AF in FIG. 7) are those thicknesses at which antiferromagnetic coupling of the two ferromagnetic films occurs, resulting in the desired antiparallel alignment (arrows 83, 85) of the magnetizations in the two films. Thus, in the preferred embodiment, the greatest antiferromagnetic exchange coupling strength occurs at less than approximately 10Å, preferably between approximately 3-6Å. However, for this combination of materials, other Ru AF coupling film thicknesses, for example, approximately 20Å, may also be possible, although the strength of the coupling would be less than for the Ru thickness of less than 10Å. To function in a spin valve MR sensor the antiferromagnetic coupling field must be much stronger than the applied signal field so that the two free films rotate as a single unit in the presence of the signal field. The oscillatory coupling relationship for selected material combinations, of which FIG. 7 is typical, is described in detail by Parkin et al. in *Phys. Rev. Lett.*, Vol. 64, p. 2034 (1990).

While the laminated free layer 70 in the spin valve MR sensor 60 has been shown with the preferred materials of Ni-Fe and Ru as the ferromagnetic and AF coupling film, respectively, other material combinations are possible, such as iron/chromium (Fe/Cr), and other ferromagnetic materials (such as Co, Fe, Ni, and their alloys, such as Ni-Fe, Ni-Co, and Fe-Co) with other AF coupling films (such as Ru, Cr, rhodium (Rh), iridium (Ir), and their alloys). However, for each such material combination, the oscillatory exchange coupling relationship, such as that shown in FIG. 7 for Ni-Fe/Ru, would have to be determined, if not already known, so that the thickness of the AF coupling film can be selected to assure strong antiferromagnetic coupling between the two ferromagnetic films.

According to the present invention, the ferromagnetic sensing layer (the laminated free layer 70) consists, in the spin valve MR sensor embodiment, of the two ferromagnetic films whose magnetizations are strongly coupled antiparallel across a metallic AF coupling film. As shown in the spin valve MR sensor embodiment of FIG. 6, the live thicknesses of the two ferromagnetic films, $t_a$ and $t_b$, are unequal. The antiparallel coupling field $H_{ap}$ is sufficiently large so that in moderate magnetic fields, such as the signal field in the recorded medium, the two fields remain essentially antiparallel and respond to the signal field as a rigid unit. The net magnetic moment of the laminated free layer 70 is given by:

$$M_{net}=(M_a t_a - M_b t_b)/(t_a + t_b). \quad (1)$$

The effective net anisotropy of the free layer 70 is $$H_{net}=(H_a t_a + H_b t_b)/(t_a - t_b), \quad (2)$$

where $H_a$ and $H_b$ are the intrinsic uniaxial anisotropies of the two films 71, 73, respectively. Equation 2 assumes that the two easy axes of the films 71, 73 are aligned parallel. Smaller values of $H_{net}$, including zero, are possible by growing the two films with their easy axes oriented in different directions. For a fixed amount of external flux entering a single ferromagnetic layer, the internal field H is proportional to the flux divided by the effective thickness of the layer. The internal field H determines the angle of rotation of the magnetization in the free layer, and thus the MR response. The laminated free layer 70 will behave in a similar manner, with the effective thickness $t_{eff}$ given by $$t_{eff}=t_a-t_b \quad (3)$$

provided that the applied signal field is much smaller than $H_{ap}$. Thus, by making the two films 71, 73 of different thicknesses, the effective thickness of free layer 70 is reduced. On the other hand, the magnetoresistance remains large, since it is mostly determined by the relatively large thickness $t_a$. The actual thickness of layer 73 is important because a certain amount of live material is necessary to maintain the magnetoresistance.

Figure 8:
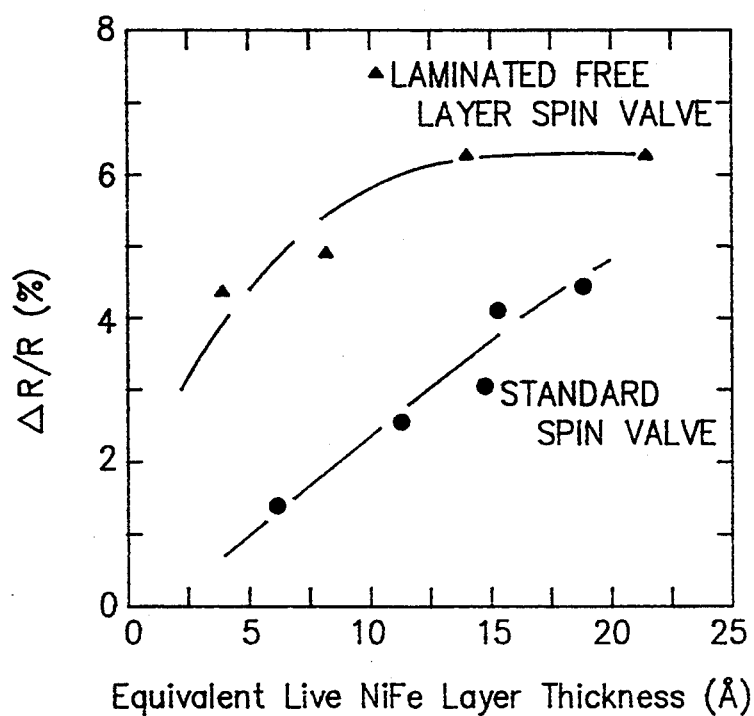
FIG. 8 is a graph of magnetoresistance versus free ferromagnetic layer thickness for the sensor depicted in FIG. 6, and for a standard spin valve sensor.

The MR transfer curves (deltaR/R as a function of applied field) were measured for four spin valve MR structures of the type shown in FIG. 6. The tested structures had the following arrangement of layers: Glass/50Å Ta/$t_b$ Ni-Fe/4Å Ru/30Å Ni-Fe/8Å, Co/$t_{Cu}$ Cu/8Å, Co/30Å Ni-Fe/110Å Fe-Mn/50Å Ta; with $t_b$=30, 35, 40, and 45Å, and $t_{Cu}$=30, 30, 35, and 40Å. Thus, films 71, 73 in the laminated free layer 70 were Ni-Fe and Ni-Fe/Co, respectively. The net magnetic moments of the two free ferromagnetic films, measured in a field of 100 Oe, corresponded to net Ni-Fe effective thicknesses, $t_{eff}$, of 24, 13, 8, and 4Å for the four tested structures. Prior to measurement of the magnetoresistance, the direction of magnetization of the pinned layer 77 (Co/Ni-Fe) was set perpendicular to its original easy axis by field cooling from 220° C. During measurement, the field was applied perpendicular to the easy axis of the free ferromagnetic layer 70, as it would be in an actual spin valve MR sensor. The results of the measured magnetoresistance for these four structures is shown as a function of $t_{eff}$ in the upper curve of FIG. 8. The lower curve represents the measured magnetoresistance for spin valve structures (of the type having thin Co films adjacent to the spacer layer) with standard free ferromagnetic layers. As shown by FIG. 8, the spin valve sensor according to the present invention shows significantly better magnetoresistance at lower live Ni-Fe thicknesses. The net anisotropy field, $H_{net}$, for the four tested structures was measured to be 10, 10, 15, and 20 Oe, respectively, which indicates that the net anisotropy is still much smaller than other fields present in the structures. Also, the measured sheet resistance for the tested structures was an acceptable value of approximately 12 Ohms, which is significantly higher than the typical lead resistance in MR sensors.

Figure 9:
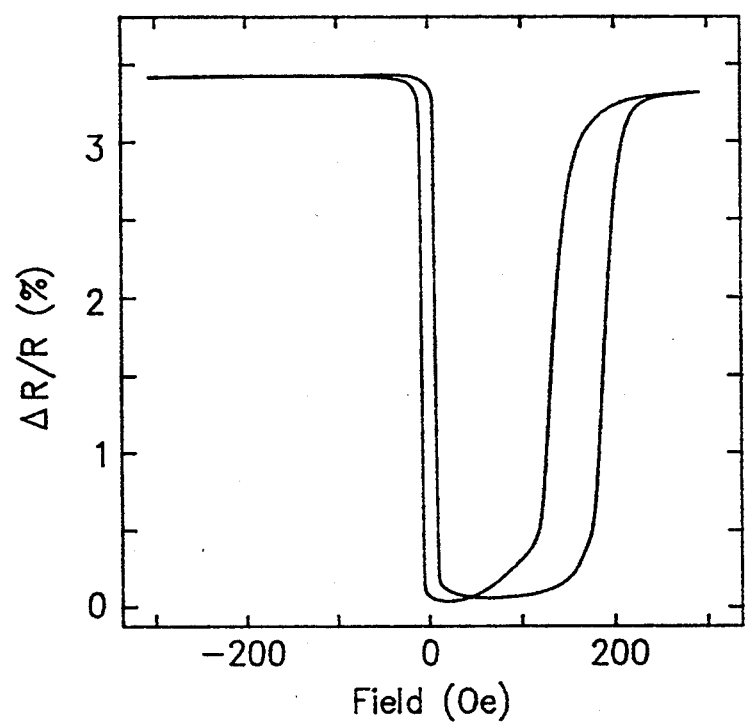
FIG. 9 is a graph of magnetoresistance as a function of applied field strength for a spin valve sensor having positive magnetoresistance, i.e., resistance is highest when the net moments of the free and pinned layers are aligned parallel.

Rigid antiparallel coupling of the two films in the free ferromagnetic layer can also be used to control the sign of the magnetoresistance. Large MR values have so far been observed only for so-called negative SVMR; i.e., in antiparallel coupled multilayers, the resistance decreases with increasing applied field. This is because the resistance is highest when the moments of the ferromagnetic layers are antiparallel, and the applied field rotates the magnetizations in a direction toward parallel. In this type of spin valve MR structure, the corresponding MR curve has a hump, rather than a trough. FIG. 9, however, shows a spin valve MR curve with a trough of magnetoresistance of 3.4%. The structure is: Glass/30Å Cu$_{50}$Au$_{50}$/50Å Ni-Fe/10Å Ru/10Å Co/28Å Cu/10Å Co/30Å Ni-Fe/110Å Fe-Mn/30Å Cu$_{50}$Au$_{50}$. The ferromagnetic sensing layer comprises the 50Å Ni-Fe and 10Å Co films separated by the 10Å Ru AF coupling film. The free Ni-Fe and Co films are strongly coupled antiparallel, with their net moment oriented antiparallel to that of the Co film. This occurs because the moment of the 50Å Ni-Fe film (its magnetization times its thickness) is greater than that of the 10Å Co film. In the low resistance state, tile free Co film between the Ru film and the Cu spin valve spacer layer has its moment aligned parallel to the moment of the pinned layer (the 10Å Co/30Å Ni-Fe layer), and thus the intrinsic spin valve magnetoresistance between the free Co film and the pinned layer across the Cu spacer layer is of the usual sign. But since the net moment of the free layer is antiparallel to the moment of the Co free film adjacent to the Cu spacer layer, the magnetoresistance is opposite to the usual case and has the opposite sign, i.e., the resistance is highest when the net moments of the free and pinned layers are parallel.

Figure 10:
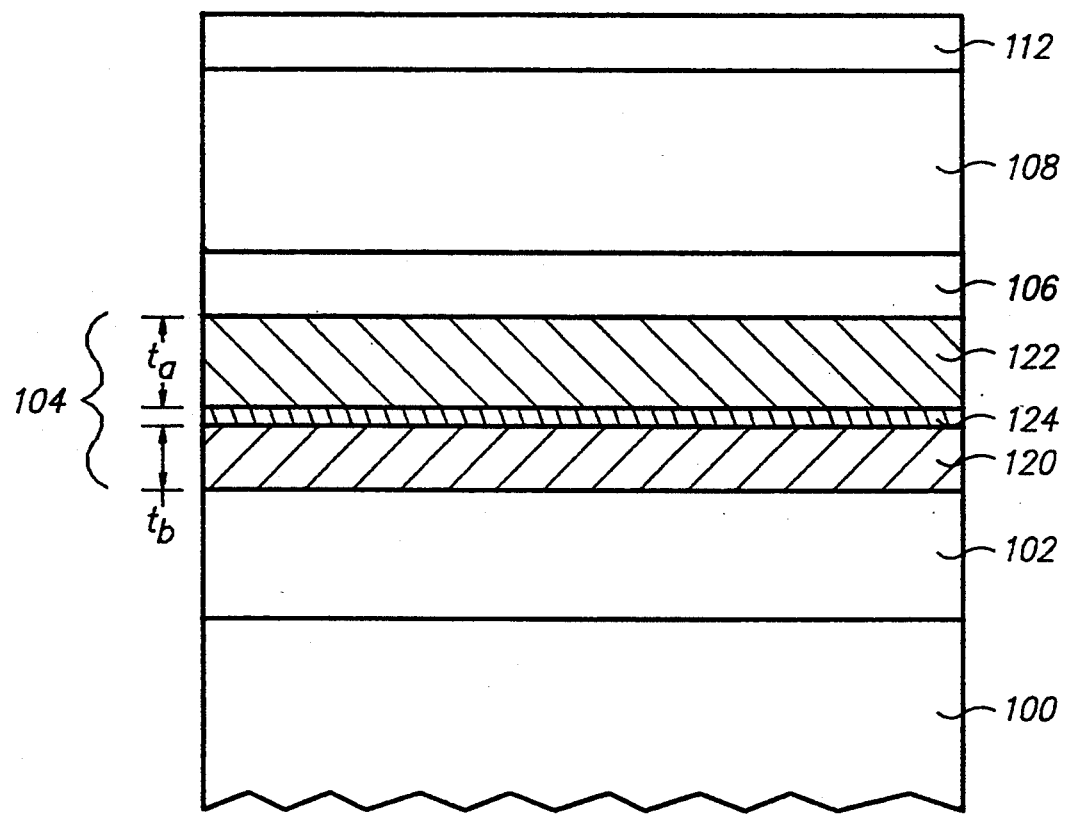
FIG. 10 is a sectional view of an AMR sensor using the laminated ferromagnetic sensing layer as the read element according to the present invention.

Referring now to FIG. 10, the AMR sensor embodiment of the present invention is illustrated. The AMR structure is fabricated on a substrate 100, which would typically be the gap material of the thin film inductive head with which the AMR sensor is incorporated. The AMR sensor typically includes a Ta underlayer 102, the laminated ferromagnetic sensing layer 104 according to the present invention which will function as the read element, a Ta layer 106, a soft bias layer 108, such as Ni-Fe-Nb, and a capping layer 110, such as a Ta layer.

Figure 11:
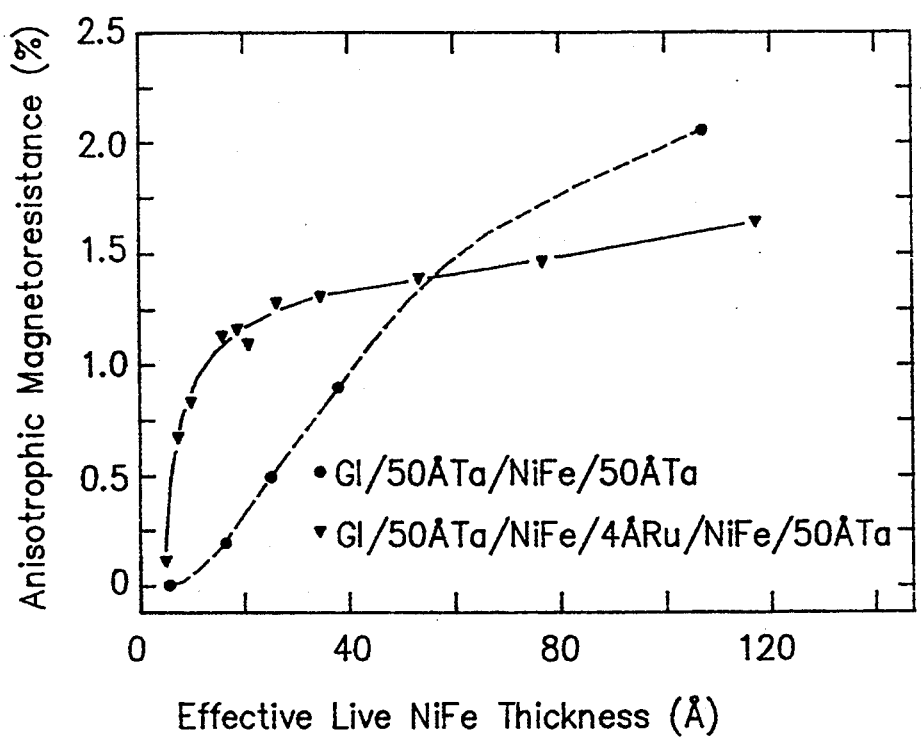
FIG. 11 are graphs of magnetoresistance versus effective live Ni-Fe thickness for an AMR sensor using the laminated ferromagnetic sensing layer of the present invention and for a standard AMR sensor.

The laminated ferromagnetic sensing layer 104 in the AMR sensor embodiment may comprise two Ni-Fe films 120, 122 of different thicknesses separated by a 4Å Ru AF coupling film 124, with the individual thicknesses of the Ni-Fe films 120, 122 selected based upon the experimental results described with respect to FIG. 11. FIG. 11 shows a comparison of the anisotropic magnetoresistance, measured in a 50 Oe rotating field, for the following two structures: Glass/50Å Ta/Ni-Fe/50Å Ta; and Glass/50Å Ta/(120−t)Å Ni-Fe/4Å Ru/t Ni-Fe/50Å, Ta. The magnetoresistance of the conventional single Ni-Fe layer is below 1% for live Ni-Fe thicknesses below 50Å, rapidly going to zero at 5Å. In contrast, the magnetoresistance for the AMR sensor with the laminated ferromagnetic sensing layer remains above 1% down to about 15Å. This is a large improvement at low effective live Ni-Fe thickness.

It should be noted that the effective net anisotropy $H_{net}$ of the ferromagnetic sensing layer increases with decreasing effective thickness, $t_{eff}$, as described previously for the spin valve MR sensor embodiment. For zero effective thickness, $t_{eff}$, the anisotropy $H_{net}$ is infinite. However, above 15Å $H_{net}$ stays below 20 or 30 Oe. Moreover, $H_{net}$ can be engineered to nearly zero by setting the two easy axes of the two laminated Ni-Fe films perpendicular to each other.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

What is claimed is:

1. An anisotropic magnetoresistive sensor for sensing an external magnetic field comprising:
a substrate; and
a ferromagnetic sensing layer formed on the substrate and comprising first and second ferromagnetic films having different magnetic moments, and an antiferromagnetically coupling film located between and in contact with the first and second ferromagnetic films, said antiferromagnetically coupling film for rigidly coupling the ferromagnetic films together antiferromagnetically, the ferromagnetic films and the antiferromagnetic coupling film being configured such that the magnetizations of the ferromagnetic films magnetizations are aligned antiparallel and remain antiparallel in the presence of the external magnetic field to be sensed.

2. A magnetoresistive sensor as in claim 1 wherein the antiferromagnetically coupling film consists essentially of Ru.

3. A magnetoresistive sensor as in claim 2 wherein the Ru film has a thickness between approximately 3 and 6 Angstroms.

4. A magnetoresistive sensor as in claim 2 wherein the first and second ferromagnetic films consist essentially of Ni-Fe.

5. A magnetoresistive sensor as in claim 1 wherein the first and second ferromagnetic films are made of a material selected from the group consisting of Co, Fe, Ni, and their alloys, and wherein the antiferromagnetically coupling film is made of a material selected from the group consisting of Ru, Cr, rhodium (Rh), iridium (It), and their alloys.

6. A magnetoresistive sensor as in claim 1 wherein the ferromagnetic films have different thicknesses.

7. A spin valve magnetoresistive sensor for sensing an external magnetic field comprising:
a substrate; and
a layered structure formed on the substrate, the layered structure comprising:
a free layer comprising a first free ferromagnetic film; a nonmagnetic antiferromagnetically coupling film adjacent to the first free ferromagnetic film; a second free ferromagnetic film adjacent to the antiferromagnetically coupling film and rigidly antiferromagnetically coupled to the first free ferromagnetic film with its direction of magnetization maintained antiparallel to the magnetization direction of the first free ferromagnetic film in the presence of the external magnetic field to be sensed, the first and second ferromagnetic films having different magnetic moments;
a nonmagnetic spacer layer adjacent to the second free ferromagnetic film;
a pinned ferromagnetic layer adjacent to the spacer layer and having an axis of magnetization generally perpendicular to the magnetization axes of the free ferromagnetic films; and
means for pinning the magnetization of the pinned ferromagnetic layer in a desired direction; whereby in the presence of the external magnetic field to be sensed the magnetization of the pinned ferromagnetic layer remains fixed and the magnetizations of the two antiferromagnetically coupled free ferromagnetic films in the free layer rotate together as a single unit.

8. A spin valve magnetoresistive sensor as in claim 7 wherein the antiferromagnetically coupling film between the first and second free ferromagnetic films consists essentially of Ru.

9. A spin valve magnetoresistive sensor as in claim 8 wherein the Ru antiferromagnetically coupling film has a thickness in the range of approximately 3-6 Angstroms.

10. A spin valve magnetoresistive sensor as in claim 7 wherein the first and second free ferromagnetic films consist essentially of Ni-Fe.

11. A spin valve magnetoresistive sensor as in claim 7 wherein the first and second free ferromagnetic films are made of a material selected from the group consisting of Co, Fe, Ni, and their alloys, and wherein the antiferromagnetically coupling film is made of a material selected from the group consisting of Ru, Cr, rhodium (Rh), iridium (Ir), and their alloys.

12. A spin valve magnetoresistive sensor as in claim 7 wherein the first and second free ferromagnetic films have different thicknesses.

13. A spin valve magnetoresistive sensor as in claim 7 wherein the free ferromagnetic film adjacent to the spacer layer has a magnetic moment less than the magnetic moment of the other ferromagnetic film.

14. A spin valve magnetoresistive sensor as in claim 7 wherein the ferromagnetic film adjacent to the nonmagnetic spacer layer comprises a first film of ferromagnetic material and a second thin film of cobalt.

15. A spin valve magnetoresistive sensor as in claim 7 wherein the means for pinning the magnetization of the pinned ferromagnetic layer comprises an exchange bias layer of antiferromagnetic material adjacent to and in contact with the pinned ferromagnetic layer, the exchange bias layer consisting of a material selected from the group consisting of iron-manganese and nickel-manganese.

16. A spin valve magnetoresistive sensor as in claim 7 wherein the nonmagnetic spacer layer between the second free ferromagnetic film and the pinned ferromagnetic layer comprises a material selected from the group consisting of silver, gold, copper, and alloys of silver, gold, and copper.

17. A magnetic recording disk drive comprising:
a magnetic recording disk;
a motor connected to the disk for rotating the disk;
a spin valve magnetoresistive sensor for sensing external magnetic fields representative of magnetically recorded data on the disk, the sensor comprising:
  a free layer comprising a first free ferromagnetic film; a nonmagnetic antiferromagnetically coupling film adjacent to the first free ferromagnetic film; a second free ferromagnetic film adjacent to the antiferromagnetically coupling film and rigidly antiferromagnetically coupled to the first free ferromagnetic film with its direction of magnetization maintained antiparallel to the magnetization direction of the first free ferromagnetic film in the presence of external magnetic fields from the disk, the first and second ferromagnetic films having different magnetic moments;
  a nonmagnetic spacer layer adjacent to the second free ferromagnetic film;
  a pinned ferromagnetic layer adjacent to the spacer layer and having an axis of magnetization generally perpendicular to the magnetization axes of the free ferromagnetic films: and
  means for pinning the magnetization of the pinned ferromagnetic layer in a desired direction; whereby in the presence of external magnetic fields from the disk the magnetization of the pinned ferromagnetic layer remains fixed and the magnetizations of the two antiferromagnetically coupled free ferromagnetic films in the free layer rotate together as a single unit;
means coupled to the spin valve magnetoresistive sensor for detecting resistance changes in the sensor responsive to the external magnetic fields representative of data bits recorded in the magnetic recording disk and intercepted by the sensor;
a carrier supporting the sensor, the carrier having a substrate onto which the sensor is attached;
an actuator for moving the carrier generally radially across the disk so the sensor may access different regions of magnetically recorded data on the disk;
means connecting the carrier to the actuator for maintaining the carrier near the disk; and
means for supporting the motor and actuator.

18. A disk drive as in claim 17 wherein the antiferromagnetically coupling film between the two free ferromagnetic films consists essentially of Ru.

19. A disk drive as in claim 18 wherein the Ru film has a thickness between approximately 3 and 6 Angstroms.

20. A disk drive as in claim 18 wherein the first and second ferromagnetic films consist essentially of Ni-Fe.

21. A disk drive as in claim 17 wherein the first and second free ferromagnetic films are made of a material selected from the group consisting of Co, Fe, Ni, and their alloys, and wherein the antiferromagnetically coupling film is made of a material selected from the group consisting of Ru, Cr, rhodium (Rh), iridium (Ir), and their alloys.

22. A disk drive as in claim 17 wherein the ferromagnetic films have different thicknesses.

23. A disk drive as in claim 17 wherein the free ferromagnetic film adjacent to the spacer layer has a magnetic moment less than the magnetic moment of the other free ferromagnetic film.

24. A disk drive as in claim 17 wherein the free ferromagnetic film adjacent to the nonmagnetic spacer layer comprises a first film of ferromagnetic material and a second thin film of cobalt.

25. A disk drive as in claim 17 wherein the magnetization pinning means comprises an exchange bias layer of antiferromagnetic material adjacent to and in contact with one of the free ferromagnetic films in the second ferromagnetic layer.

26. A disk drive as in claim 25 wherein the antiferromagnetic exchange bias layer comprises a material selected from the group consisting of iron-manganese and nickel-manganese.

27. A disk drive as in claim 17 wherein the nonmagnetic spacer layer comprises a relatively high conductivity, nonferromagnetic material.

28. A disk drive as in claim 27 wherein the nonmagnetic spacer layer comprises a material selected from the group consisting of silver, gold, copper, and alloys of silver, gold, and copper.

29. A magnetic storage system comprising:
a magnetic storage medium having a plurality of tracks for the recording of data;
a magnetic transducer maintained close to the magnetic storage medium during relative motion between the magnetic transducer and the magnetic storage medium, the magnetic transducer including an anisotropic magnetoresistive sensor for sensing an external magnetic field, the anisotropic magnetoresistive sensor comprising:
  (a) a substrate; and
  (b) a ferromagnetic sensing layer formed on the substrate and comprising first and second ferromagnetic films having different magnetic moments, and an antiferromagnetically coupling film located between and in contact with the first and second ferromagnetic films for rigidly coupling the ferromagnetic films together antiferromagnetically so that their magnetizations are aligned antiparallel and remain antiparallel in the presence of the external magnetic field to be sensed; and
means coupled to the anisotropic magnetoresistive sensor for detecting resistance changes in the anisotropic magnetoresistive sensor responsive to magnetic fields representative of data bits recorded in the magnetic storage medium intercepted by the anisotropic magnetoresistive sensor.

30. A magnetic storage system comprising:
   a magnetic storage medium having a plurality of tracks for the recording of data;
   a magnetic transducer maintained close to the magnetic storage medium during relative motion between the magnetic transducer and the magnetic storage medium, the magnetic transducer including a spin valve magnetoresistive sensor for sensing an external magnetic field, the spin valve magnetoresistive sensor comprising:
   (a) a substrate; and
   (b) a layered structure formed on the substrate, the layered structure comprising:
      (i) a free layer comprising a first free ferromagnetic film; a nonmagnetic antiferromagnetically coupling film adjacent to the first free ferromagnetic film; a second free ferromagnetic film adjacent to the antiferromagnetically coupling film and rigidly antiferromagnetically coupled to the first free ferromagnetic film with its direction of magnetization maintained antiparallel to the magnetization direction of the first free ferromagnetic film in the presence of the external magnetic field to be sensed, the first and second ferromagnetic films having different magnetic moments;
      (ii) a nonmagnetic spacer layer adjacent to the second free ferromagnetic film;
      (iii) a pinned ferromagnetic layer adjacent to the spacer layer and having an axis of magnetization generally perpendicular to the magnetization axes of the free ferromagnetic films; and
      (iv) means for pinning the magnetization of the pinned ferromagnetic layer in a desired direction; whereby in the presence of the external magnetic field to be sensed, the magnetization of the pinned ferromagnetic layer remains fixed and the magnetizations of the two antiferromagnetically coupled free ferromagnetic films in the free layer rotate together as a single unit; and
   means coupled to the spin valve magnetoresistive sensor for detecting resistance changes in the spin valve magnetoresistive sensor responsive to magnetic fields representative of data bits recorded in the magnetic storage medium intercepted by the spin valve magnetoresistive sensor.

* * * * *

UNITED STATES PATENT AND TRADEMARK OFFICE
CERTIFICATE OF CORRECTION

PATENT NO.   : 5,408,377
DATED        : April 18, 1995
INVENTOR(S)  : Bruce A. Gurney et al.

It is certified that error appears in the above-identified patent and that said Letters Patent is hereby corrected as shown below:

Claim 1, col. 9, line 58, after "film" delete "for".
             line 62, after "films" delete "magnetizations".

Signed and Sealed this

Seventeenth Day of October, 1995

Attest:

BRUCE LEHMAN

Attesting Officer         Commissioner of Patents and Trademarks